United States Patent
Tellkamp

(10) Patent No.: US 6,747,343 B2
(45) Date of Patent: Jun. 8, 2004

(54) ALUMINUM LEADFRAMES WITH TWO NICKEL LAYERS

(75) Inventor: John P. Tellkamp, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/303,617

(22) Filed: Nov. 25, 2002

(65) Prior Publication Data

US 2003/0107112 A1 Jun. 12, 2003

Related U.S. Application Data

(62) Division of application No. 09/520,556, filed on Mar. 8, 2000, now Pat. No. 6,518,647.

(51) Int. Cl.[7] .......................... H01L 23/50; H01L 23/48; H01L 29/44; C23C 18/18
(52) U.S. Cl. ....................... 257/666; 257/676; 257/692; 257/693; 257/696; 257/698; 257/762; 257/766; 257/767; 257/768; 257/769; 257/753; 257/179
(58) Field of Search ................................. 257/666, 646, 257/676, 692, 693, 696, 698, 762, 766, 767, 768, 769, 777, 753, 179

(56) References Cited

U.S. PATENT DOCUMENTS

| 4,612,167 A | 9/1986 | Watanabe et al. |
| 5,343,073 A | 8/1994 | Parthasarathi et al. |
| 5,409,996 A | 4/1995 | Shinohara et al. |

FOREIGN PATENT DOCUMENTS

| JP | 04231432 A | 8/1992 |
| JP | 06184680 A | 7/1994 |
| JP | 06302756 A | 10/1994 |

*Primary Examiner*—Alexander Oscar Williams
(74) *Attorney, Agent, or Firm*—Yingsheng Tung; Wade James Brady, III; Frederick J. Telecky, Jr.

(57) ABSTRACT

A leadframe for use with integrated circuit chips comprising a leadframe base made of aluminum or aluminum alloy having a surface layer of zinc; a first layer of nickel on said zinc layer, said first nickel layer deposited to be compatible with aluminum and zinc; a layer of an alloy of nickel and a noble metal on said first nickel layer; a second layer of nickel on said alloy layer, said second nickel layer deposited to be suitable for lead bending and solder attachment; and an outermost layer of noble metal, whereby said leadframe is suitable for solder attachment to other parts, for wire bonding, and for corrosion protection.

21 Claims, 1 Drawing Sheet

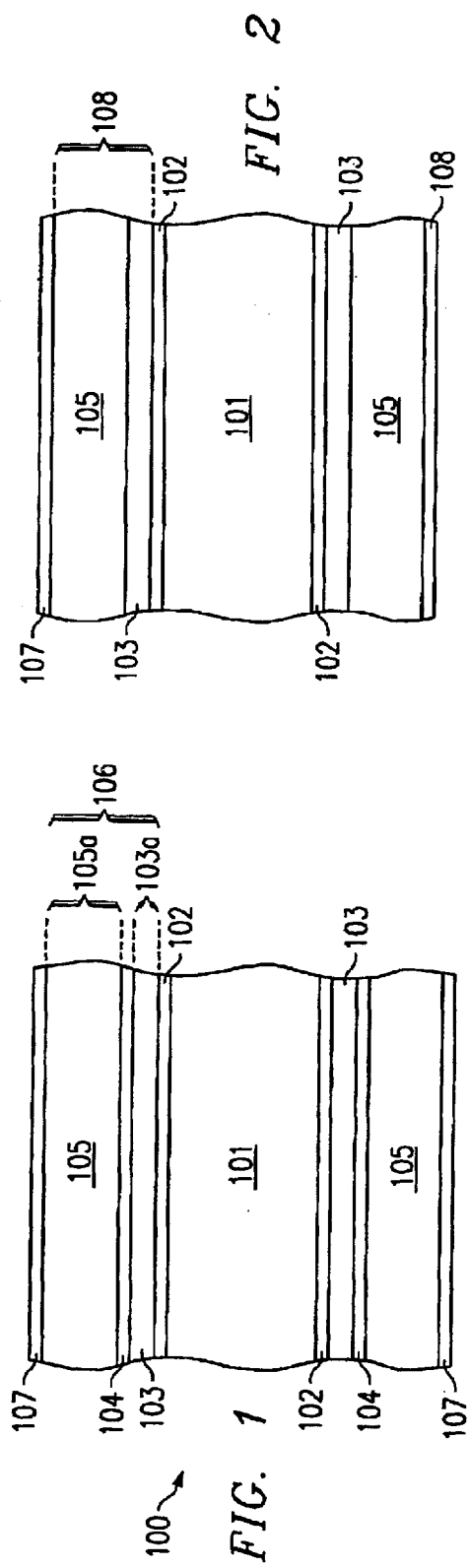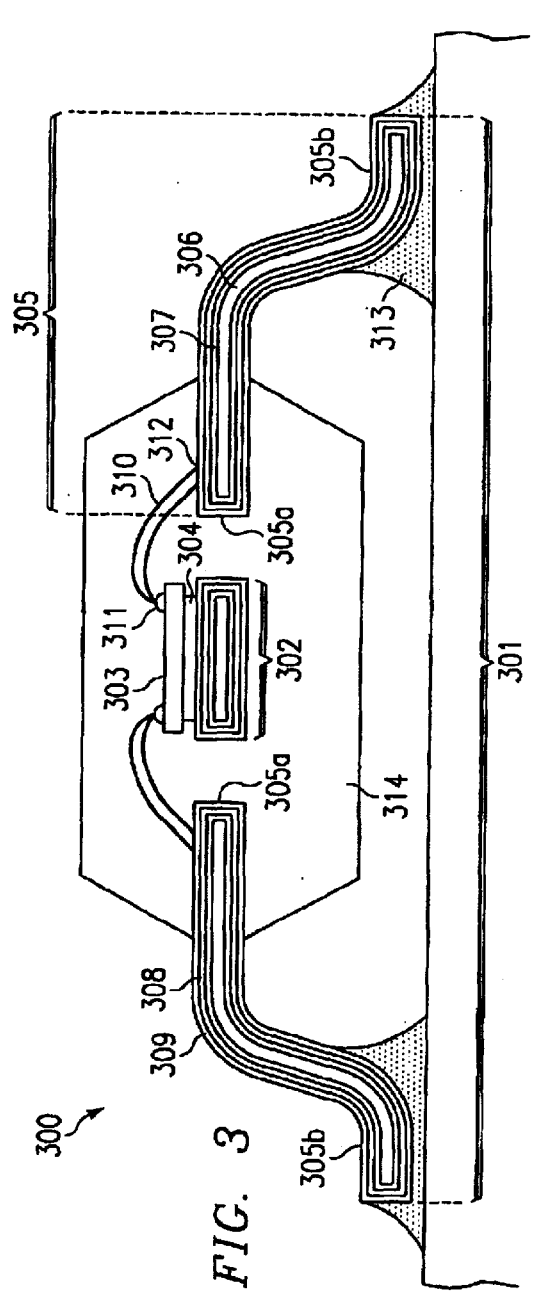

ALUMINUM LEADFRAMES WITH TWO NICKEL LAYERS

This is a divisional of application Ser. No. 09/520,556 filed Mar. 8, 2000 now U.S. Pat. No. 6,518,647.

FIELD OF THE INVENTION

The present invention is related in general to the field of semiconductor devices and processes and more specifically to the material and fabrication of leadframes for integrated circuit devices.

DESCRIPTION OF THE RELATED ART

The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips. Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 μm) sheets of metal. For reasons of easy manufacturing, the commonly selected starting metals are copper, copper alloys, iron-nickel alloys, and invar. Leadframes made of iron-nickel alloys (for instance the so-called "Alloy 42") are about six times more expensive than copper leadframes. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

Cost reduction pressures in semiconductor manufacturing have initiated a search for replacing the copper and Alloy 42 leadframe base metals with lower cost materials. The early proposal to select aluminum could not solve the problem of breaking through the stable, omnipresent and almost instantaneous aluminum oxide. In U.S. Pat. No. 3,932,685, issued on Jan. 13, 1976 (Flowers, "Aluminum Stabilization Process and Stabilization Solution therefor"), a process for preparing aluminum leadframes for wire bonding during semiconductor device assembly is described; however, the difficult problem of preparing aluminum leadframes for solder attachment is not addressed.

The plating process for stainless steel in U.S. Pat. No. 4,604,169, issued on Aug. 5, 1986 (Shiga et al., "Process for Metal Plating a Stainless Steel") does not apply to aluminum and its heavy oxide layer. Silver layers are not desirable in semiconductor products (U.S. Pat. No. 4,529,667, issued on Jul. 16, 1985, Shiga et al., "Silver-Coated Electric Composite Materials"). The corrosion resistance achieved by the plating methods in U.S. Pat. No. 4,601,958, issued on Jul. 22, 1986 (Levine, "Plated Parts and their Production") and U.S. Pat. No. 4,835,067, issued on May 30, 1989 (Levine, "Corrosion Resistant Electroplating Process, and Plated Article") cannot be transferred to aluminum because the proposed protective layers would not adhere to aluminum; the iron-based alloys of those patents (Alloy 42 and Kovar) are expensive leadframe materials.

The method to produce an aluminum-coated leadframe in U.S. Pat. No. 4,604,291, issued on Aug. 5, 1986 (Huang et al., "Method for Manufacture of Aluminum-Coated Leadframe") requires high vacuum and is thus impractical for mass production; it also does not address the problem of solder attachment.

The method to fabricate solder bumps on aluminum pads of a silicon chip described in U.S. Pat. No. 5,795,619, issued on Aug. 18, 1998 (Lin et al., "Solder Bump Fabricated Method Incorporate with Electroless Deposit and Dip Solder") employs a process flow starting with forming a zinc layer on the aluminum using a zinc displacement solution. The subsequent dip into a sodiumhydrophosphate solution containing nickel and copper produces a nickel-copper-phosphorus layer on the zinc layer. Using a flux, the subsequent dip into a solder bath forms a solder alloy for solder bumps on the silicon chip. The nickel layer produced by this method is rich in copper (up to 74 weight % copper) and brittle; if this layer were applied to a leadframe, it would not be suitable, because leadframes have to undergo the demanding process step of bending and forming the leads before they are attached by solder to a printed circuit board. This forming step requires ductile leads. Further, the described technique, if applied to a leadframe, would offer no protection against corrosion of the leads and would also not be recommendable for a semiconductor product having a leadframe encapsulated in a molding compound where metal-to-plastic adhesion, low mechanical stress, and corrosion protection are required.

An urgent need has therefore arisen for a low-cost, reliable mass production method for a leadframe having an aluminum base, ductile leads and a surface which is simultaneously solderable and bondable. The leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

According to the present invention for a semiconductor integrated circuit (IC) leadframe, aluminum or aluminum alloy serves as the starting material, followed by a sequence of deposited layers consisting of zinc (providing adhesion to aluminum and to nickel), electroless nickel (protecting the zincate from the electroplating solution), an optional nickel alloy (providing corrosion protection), electroplated nickel (providing ductility and solderability), and, outermost, a noble metal (protecting the nickel surface from oxidation).

The present invention is related to high density ICs, especially those having high numbers of inputs/outputs, or contact pads, and also to devices in packages requiring surface mount in printed circuit board assembly. These ICs can be found in many semiconductor device families such as standard linear and logic products, processors, digital and analog devices, high frequency and high power devices, and both large and small area chip categories. The invention represents a significant cost reduction of the semiconductor packages, especially the plastic molded packages, compared to the conventional copper or iron-nickel alloy leadframes.

It is an aspect of the present invention to provide a technology for modifying the surfaces of aluminum-based leadframes to provide both ductility and solderability without requiring costly fabrication processes. The aspect is achieved by mass production processes based on reel-to reel manufacturing.

Another aspect of the invention is to reach these goals without cost of equipment changes and new capital investment and using the installed fabrication equipment base.

Another aspect of the present invention is to provide the aluminum leadframes so that the successful surface mount technologies based on bending the package leads and solder attaching lead portions without flux (or only very mild fluxes not requiring rinse steps) can be continued. The end user of the semiconductor product can continue to employ the installed assembly equipment base.

Another aspect of the present invention is to provide easy bondability under the conditions defined by fine pitch bonding.

Another aspect of the present invention is provide the aluminum leadframes so that they exhibit good adhesion to the molding compounds used in plastic packages, thus preventing moisture ingress and corrosion, and also provide corrosion protection of the leads.

These aspects have been achieved by the teachings of the invention concerning material selection and methods suitable for mass production. Various modifications have been successfully employed.

In the first embodiment of the invention, aluminum leadframes are produced with an intermediate layer of an alloy between nickel and a noble metal coupling the layers of electroless nickel and electroplated nickel.

In the second embodiment of the invention, aluminum leadframes are produced without this intermediate layer.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a schematic cross sectional view of a portion of a leadframe made of aluminum and a sequence of deposited layers according to the first embodiment of the invention.

FIG. 2 is a schematic cross sectional view of a portion of a leadframe made of aluminum and a sequence of deposited layers according to the second embodiment of the invention.

FIG. 3 is a schematic and simplified cross sectional view of a packaged semiconductor device having a leadframe according to the invention, solder assembled on a substrate.

DETAILED DESCRIPTION OF THE PREFERRED EMBODIMENTS

The present invention is related to the assembly of semiconductor ICs on leadframes, the base material of these leadframes and the process of fabricating these leadframes so that they become suitable for the needs of semiconductor assembly. In today's technology, the leadframes of semiconductor are made of copper alloys or iron-nickel alloys. These materials are dense (and expensive). For instance, copper has a density of 9.1 g/cm$^3$ with a Young's modulus of $120 \times 10^3$ N/mm$^2$, and a thermal expansion rate of 17.6 ppm/° C. These properties contribute to two problems:

High mass and cost of leadframe base metal;

High thermomechanical stress levels on silicon chips and high thermomechanical stress levels on solder joints in board attach.

The present invention minimizes these problems by taking advantage of aluminum instead of copper as the base material of semiconductor leadframes. Table 1 compiles important characteristics of copper and compares them with the characteristics of aluminum.

TABLE 1

| Attribute | Copper Alloy (CDA-194) | Aluminum Alloy (AA2014-T6) |
|---|---|---|
| Density (g/cm$^3$) | 9.1 | 2.8 |
| Raw material cost ($/kg) | 1.65 | 1.32 |
| Young's Modulus × 10$^3$ (N/mm$^2$) | 120 | 72.5 |
| Ultimate tensile strength (N/mm$^2$) | 550 | 410 |
| Thermal Conductivity (calcm/cm$^2$s ° C.) | .625 | .542 |
| Thermal Coefficient of Expansion (ppm/° C.) | 17.6 | 24.7 |
| Galvanic Potential (V) | +0.52 | −0.40 |

As Table 1 indicates, density and cost advantages are complimentary, and the lower Young's modulus of aluminum will help compensate for the higher thermal coefficient of expansion for thermomechanical stress. The comparison of the attributes of copper and aluminum in Table 1 shows that aluminum alloys can not only compete effectively with copper alloys, but they also have clear advantages, especially as related to cost (raw material, weight, malleability, etc.). Roughly, aluminum is ⅓ the density of copper, and will reduce the mass (weight) and cost of leadframe base materials. Stress levels will be reduced for aluminum alloys since the coefficient of thermal expansion multiplied by the Young's modulus is less than that for copper alloys. The thermal conductivity of aluminum is similar to the thermal conductivity of copper. Given the dimensions of typical leadframes, the lower electrical conductivity of aluminum plays a subordinate role compared to the unavoidable conductivity loss in the thin bonding wires.

The base material of the leadframes of the present invention are sheets of aluminum or aluminum alloy, typically 100 to 250 μm thick. These sheets are commercially available, for example, from the division "Tennalum" of Kaiser Aluminum Corporation, Jackson, Tenn., USA. The material preferred by this invention is an alloy of aluminum with manganese (series 3xxx, for instance 3004, wherein the digits in the alloy designation indicate alloy modifications). Other alloys are manufactured, for example, with copper, silicon, magnesium, and zinc. These aluminum and aluminum alloy sheets come in modifications of various thermal histories, such as tempered, annealed, or strain hardened, resulting is various hardnesses. It is important for the purpose of this invention that the aluminum and the aluminum alloys offer an elongation of at least 5 to 10% in order to satisfy the requirements of outer segment forming, which is the last process step in the fabrication flow.

Leadframes made of aluminum follow the same design concepts as copper leadframes: Usually, a chip pad for support of the IC chip surrounded by segments having an inner tip in proximity of the chip pad, and outer tips remote from the chip pad.

Further, aluminum leadframes, like copper leadframes, have to satisfy five needs in semiconductor assembly:

1) Leadframes have to comprise outer segment tips for solder attachment to other parts;
2) leadframes have to comprise inner segment tips for bond attachments to wires;
3) leadframes have to comprise outer segments ductile for forming and bending the segments;
4) leadframe surfaces have to comprise adhesion to molding compounds; and
5) leadframe segments have to comprise insensitivity to corrosion.

According to the teachings of this invention, need 1) is satisfied by depositing a layer of nickel and an outermost layer of a noble metal over the aluminum surface. When the noble metal is dissolved in the solder operation, the solder joint is made to the nickel surface and not the base aluminum. The process of securing adhesion of the nickel layer to the aluminum base is a pivotal part of this invention (see below).

The invention satisfies Need 2) by the choice of the noble metal layer employed to fulfill need 1).

The invention satisfies Need 3) by the selection of thickness and structure of the nickel layer employed to fulfill need 1). It is an important part of this invention; as seen below, a separation into two nickel layers, with an optional alloy middle layer, is required to insure ductility.

The invention satisfies Need 4) by the choice of the noble metal layer employed to fulfill need 1).

The invention satisfies Need 5) by the sequence of layer deposited over the aluminum base.

In FIG. 1, the schematic cross section of a leadframe portion according to the invention is generally designated 100. The aluminum alloy base sheet 101 has a preferred thickness in the range from 100 to 250 μm; thinner sheets are possible. The ductility in this thickness range provides the 5 to 15% elongation needed in the segment bending and forming operation. The aluminum alloy sheet is first immersed in an alkaline preclean solution at 20 to 90° C. for few seconds up to 3 minutes. Oils and other contamination is thereby removed.

After rinsing, the sheet is next immersed in an acid activation bath at room temperature for few seconds up to 5 minutes. The bath consists of a solution of nitric acid or nitric/sulfuric acid solution, preferably at about 30 to 60 g/l concentration. This solution removes aluminum oxide and leaves the metallic aluminum surface in an activated state, ready to accept the deposition of metallic zinc.

For the zinc deposition, the activated aluminum or aluminum alloy sheet is immersed in a zincate such as the "Bondal" solution commercially available form the Canning Gumm Company, Kearny, N.J., USA. The zincate is preferably at about 15 to 50° C.; the immersion lasts from few seconds to about 5 minutes, and may be repeated in a separate exposure. The zinc layer (102 in FIG. 1) may only be a thin film, but should cover the aluminum surface without interruption. Its function is solely to establish the reliable adhesion of the following nickel layer to the aluminum.

It is essential that the first nickel layer 103 is deposited so that the deposition solution does not electrochemically attack the zinc layer. Consequently, the first nickel layer has to be deposited electroless; using the (more controllable and uniform) electroplating process would damage the zinc layer. Typically, the solution is between −25 and +60° C. and the deposition lasts from about 1 to 10 minutes. The thickness 103a of the electroless nickel is preferably between about 125 and 750 nm, but is not critical. Alternatively, an alkaline electro-nickel process may be used.

In the embodiment of the invention shown in FIG. 1, the next deposited layer 104 is an alloy between nickel and a noble metal selected from a group consisting of palladium, rhodium, gold, silver, and platinum. The alloy layer is deposited by electroplating and between about 25 and 75 nm thick. It should be coherent since its main purpose is corrosion protection. An alloy layer based on nickel-palladium is described in the European Patent #0335608B1, issued Jun. 14, 1995 (Abbott, "Leadframe with Reduced Corrosion").

The important layer 105 is electroplated nickel, deposited preferably for a thickness 105a of about 0.5 to 3 μm. This nickel layer has to be ductile in order to be malleable in the leadframe segment bending and forming process. Further, the nickel surface has to be wettable in the soldering process, so that solder alloys or conductive adhesives can be used successfully.

The overall thickness 106 of the two nickel layers and the thin nickel alloy layer is in the range of 650 and 4000 nm.

The outermost layer of the embodiment in FIG. 1 is the layer 107, comprising an electroplated noble metal selected from a group consisting of palladium, rhodium, gold and silver. If minimum interdiffusion with solder is desired, layer 107 may also consist of platinum. Layer 107 is preferably between 10 and 75 nm thick; its main purpose is to protect the nickel surface from oxidation.

In the embodiment of the invention shown in the schematic cross section of FIG. 2, the aluminum base alloy 101 of the leadframe is again protected by the zinc layer 102. The electroless nickel layer 103, however, is directly followed by the electroplated nickel layer 105; the nickel alloy layer is omitted. The combined thickness 108 of nickel layers 103 and 105 may be in the range from 600 to 4000 nm. A thin layer 107 of noble metal forms again the outermost layer.

In the schematic cross section of FIG. 3, the aluminum or aluminum alloy leadframe 301 of the invention is shown as applied in the assembly of a semiconductor package generally designated 300. Leadframe 301 has a chip mount pad 302 onto which an IC chip 303 is attached using adhesive material 304 (typically an epoxy or polyimide which has to undergo polymerization). Leadframe 301 further has a plurality of lead segments 305. These lead segments have a first end 305a near the chip mount pad 302 and their second end 305b remote from mount pad 302.

As shown in FIG. 3 schematically, leadframe 301 comprises base 306 made of aluminum or aluminum alloy. On the surface of this aluminum is a sequence of layers, described in detail in FIGS. 1 and 2. Closest to the aluminum is a layer 307 of zinc. This layer is followed by a first layer of nickel, an alloy layer made of nickel and a noble metal, and a second layer of nickel. In FIG. 3, these three layers are combined and generally designated 308. The outermost layer 309 is made of a noble metal. As emphasized in FIGS. 1 an 2, it is an advantage of this layer sequence that segment ends 305b and the leadframe are protected against corrosion.

As described above, this sequence of layers provides reliable wire bonding for connecting the chip contact pads to the leadframe segments. In FIG. 3, bonding wires 310 have balls 311 bonded to the chip contact pads and stitches 312 welded to noble metal surface 309 of leadframe segments 305. Alternatively, ball bond or wedge bonds can be used as contacts to the segments. The bonding wires are selected from a group consisting of gold, copper, aluminum, and alloys thereof. Any of these metals provide reliable bonding contacts to the aluminum-based leadframes of the invention.

As shown in FIG. 3, the second ends 305b of segments 305 are suitable for bending and forming due to the ductility of the aluminum base and the electroplated nickel layer. Using this malleable characteristic, segments 305 may be formed in any shape required for surface mounting or any other technique of board attach of the semiconductor devices. The bending of the segments does not diminish the corrosion protection of the second segment ends 305b. For example, FIG. 3 indicates a so-called "gull wing shape" of segments 305. This shape is widely used for IC packages in the so-called "small outline" configuration, as illustrated in FIG. 3.

The aluminum leadframe of the invention provides for easy and reliable solder attachment to boards or other parts of the formed leadframe segments. In FIG. 3, solder attach material 313 comprises materials selected from a group consisting of tin/lead mixture, tin/indium, tin/silver and conductive adhesive compounds. Dependent on the selection of the metal of the outermost layer 309, this layer may be dissolved (not shown in FIG. 3) into the solder material during the attachment process so that direct solder wetting to the nickel layer 308 is achieved.

In FIG. 3, molding compound 314 encapsulates the mounted chip 303, bonding wires 310 and the first ends 305a of the lead segments 305. The second, remote ends 305b of the segments are not included in the molded package; they remain exposed for solder attachment. Typically, the encapsulation material 314 is selected from a group consisting of epoxy-based molding compounds suitable for adhesion to the outermost layer 309 of the leadframe. For instance, if layer 309 is made of palladium, excellent adhesion characteristics to molding compounds can be achieved, preventing package delamination, moisture ingress and corrosion.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the fabrication method of the aluminum or aluminum alloy leadframe may be modified by rinsing steps, repeated deposition steps, or different material selections to achieve adhesion. It is therefore intended that the appended claims encompass any such modifications or embodiments.

I claim:

1. A leadframe for use with integrated circuit chips comprising:
    a leadframe base made of aluminum or aluminum alloy having a surface layer of zinc;
    a first layer of nickel on said zinc layer;
    a layer of an alloy of nickel and a noble metal on said first nickel layer;
    a second layer of nickel on said alloy layer, said second; and
    an outermost layer of noble metal.

2. The leadframe according to claim 1 wherein said layer of noble metal is between 10 and 250 nm thick.

3. The leadframe according to claim 1 wherein said alloy layer is between 25 and 75 nm thick.

4. The leadframe according to claim 1 wherein said noble metal is selected from a group consisting of gold, silver, palladium, rhodium, and platinum.

5. A leadframe for use with integrated circuit chips comprising:
    a leadframe base made of aluminum or aluminum alloy having a surface layer of zinc;
    a first layer of electroless nickel on said zinc layer;
    a second layer of electroplated nickel on said first layer of nickel; and
    an outermost layer of noble metal.

6. A semiconductor device comprising:
    a leadframe comprising a chip mount pad for an integrated circuit chip and a plurality of lead segments having their first end near said mount pad and their second end remote from said mount pad;
    said leadframe made of aluminum or aluminum alloy having a surface layer of zinc, a first layer of nickel, a layer of an alloy of nickel and a noble metal, a second layer of nickel and an outermost layer of noble metal;
    an integrated circuit chip attached to said mount pad; and
    bonding wires interconnecting said chip and said first ends of said lead segments.

7. The device according to claim 6 wherein said bonding wires are selected from a group consisting of gold, copper, aluminum and alloys thereof.

8. The device according to claim 6 the bonding wire contacts to said nearby ends of said lead segments comprise welds made by ball bonds, stitch bonds, or wedge bonds.

9. The device according to claim 6 further having encapsulation material surrounding said mounted chip, bonding wires and nearby ends of said lead segments, leaving said remote ends of said lead segments exposed.

10. The device according to claim 9 wherein said encapsulation material is selected from a group consisting of epoxy-based molding compounds suitable for adhesion to said leadframe.

11. The device according to claim 9 further comprising lead segments having said second ends bent, whereby said leads segments obtain a form suitable for solder attachment to other parts.

12. The device according to claim 11 wherein said segment bending does not diminish said corrosion protection of said second segment ends.

13. A semiconductor device comprising:
    a leadframe comprising a chip mount pad for an integrated circuit chip and a plurality of lead segments having their first end near said mount pad and their second end remote from said mount pad;
    said leadframe made of aluminum or aluminum alloy having a surface layer of zinc, a first layer of nickel over said zinc layer, a layer of an alloy of nickel and a noble metal over said first nickel layer, a second layer of nickel over said alloy layer, and an outermost layer of noble metal over said second layer of nickel; an integrated circuit chip attached to said mount pad; and
    bonding wires interconnecting said chip and said first ends of said lead segments.

14. The device according to claim 13 wherein said layer of noble metal is between 10 and 250 nm thick.

15. The device according to claim 13 wherein said alloy layer is between 25 and 75 nm thick.

16. The device according to claim 13 wherein said noble metal is selected from a group consisting of gold, silver, palladium, rhodium, and platinum.

17. The device of claim 13 wherein said first nickel layer is an electroless nickel layer.

18. The device of claim 13 wherein said second nickel layer is an electroplated nickel layer.

19. A semiconductor device comprising:

a leadframe comprising a chip mount pad for an integrated circuit chip and a plurality of lead segments having their first end near said mount pad and their second end remote from said mount pad;

said leadframe made of aluminum or aluminum alloy having a surface layer of zinc, a first layer of electroless nickel over said zinc layer, a second layer of electroplated nickel over said first layer of nickel, and an outermost layer of noble metal over said second layer of nickel;

an integrated circuit chip attached to said mount pad; and bonding wires interconnecting said chip and said first ends of said lead segments.

20. The leadframe according to claim 19 wherein said layer of noble metal is between 10 and 250 nm thick.

21. The device according to claim 19 said noble metal is selected from a group consisting of gold, silver, palladium, rhodium, and platinum.

* * * * *